United States Patent [19]

van der Wijst

[11] Patent Number: 4,554,614
[45] Date of Patent: Nov. 19, 1985

[54] ELECTRIC CIRCUIT ASSEMBLY COMPRISING A PRINTED WIRING BOARD

[75] Inventor: Hendricus M. van der Wijst, Eindhoven, Netherlands

[73] Assignee: U.S. Philips Corporation, New York, N.Y.

[21] Appl. No.: 498,618

[22] Filed: May 27, 1983

[30] Foreign Application Priority Data

Jun. 7, 1982 [NL] Netherlands .......... 8202285

[51] Int. Cl.[4] ............................................. H05K 1/18
[52] U.S. Cl. ............................... 361/400; 174/138 G; 339/17 R; 331/108 R; 361/404; 361/408
[58] Field of Search .................. 361/401, 400, 408; 174/138 G, 152 C, 35 C; 339/17 R

[56] References Cited

U.S. PATENT DOCUMENTS

| 2,019,625 | 11/1935 | O'Brien | 174/68.5 |
|---|---|---|---|
| 2,148,201 | 2/1939 | Houwink | 339/17 R |
| 2,547,022 | 4/1951 | Leno | 174/68.5 |
| 3,366,914 | 1/1968 | McManus | 361/401 X |
| 3,366,920 | 1/1968 | Laudig et al. | 339/17 R X |
| 3,517,272 | 6/1970 | Lee et al. | 361/401 |
| 3,648,114 | 3/1972 | Manuali et al. | 361/401 |
| 3,663,866 | 5/1972 | Iosue et al. | 361/401 X |
| 3,971,610 | 7/1976 | Buchoff et al. | 339/17 R |
| 4,405,971 | 9/1983 | Ohsawa | 361/401 |
| 4,460,227 | 7/1984 | Ball | 174/152 G |

FOREIGN PATENT DOCUMENTS 1246288 9/1971 United Kingdom .............. 361/400

Primary Examiner—R. R. Kucia
Attorney, Agent, or Firm—David R. Treacy

[57] ABSTRACT

A supporting plate having a network of conductors, on which supporting plate a number of circuit components are placed which are interconnected in the network of conductors in an electric circuit. In a place of the circuit which is sensitive to moisture, a board opening is provided in which a member of a minimum moisture-absorbing material is fitted. The connections of the surrounding circuit components extend in an aperture of the member and are electrically interconnected there. The stability of the circuit is considerably improved thereby in particular in the case in which the circuit is an oscillator circuit.

8 Claims, 3 Drawing Figures

ELECTRIC CIRCUIT ASSEMBLY COMPRISING A PRINTED WIRING BOARD

BACKGROUND OF THE INVENTION

The invention relates to an electric circuit assembly comprising a network of printed circuit conductors on a printed wiring board and a number of circuit components which are interconnected through the conductors.

It is known to provide printed circuits or conductors on printed circuit boards, to insert circuit components into holes in the boards, and to connect the various parts of the circuit at the connection places, for example by soldering, in particular by immersing in a solder bath. The material of the printed circuit boards is usually a glass fibre-reinforced polyester resin which satisfies the imposed requirements as regards thickness and rigidity.

It has been found that the properties of the electric circuits built up in the above-described manner can vary when the moisture content of the ambient air varies. This relates in particular to variations in the oscillator frequency of oscillator circuits; for example, those present in U.H.F. tuners. The most critical point proves to be the top of the oscillator resonant circuit. It has been found that the stray capacitance of the printed circuit board at this point varies under the influence of moisture and causes variations in the oscillator frequency.

The invention provides a particularly simple and effective solution to reduce this problem.

SUMMARY OF THE INVENTION

For that purpose, an electric circuit assembly of the type described in the opening paragraph is characterized in that the printed wiring board has an opening in which an apertured member of an electrically insulating moisture impermeable material is fitted, and that a number of circuit components are electrically interconnected by connections disposed in the aperture of the member.

Providing an apertured member (for example a small ring) of a moisture impermeable material (synthetic resins, for example polytetrafluoroethylene, are very suitable for this purpose) in printed wiring boards, and inserting into the aperture and soldering together the connections of certain circuit components, causes the stray capacitance in that place in the circuit vary considerably less under the influence of varying moisture contents of the ambience. In the case of an oscillator circuit the oscillation frequency thus varies much less, in a given case 70% less.

An embodiment of the device according to the invention will be described in greater detail with reference to the drawing.

DESCRIPTION OF THE PREFERRED EMBODIMENT

Figure 1:
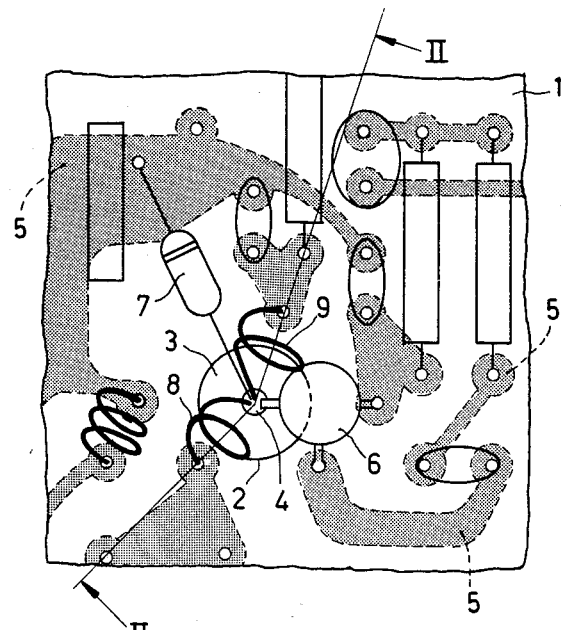
FIG. 1 is a plan view of a printed circuit assembly comprising a printed wiring board.
Figure 2:
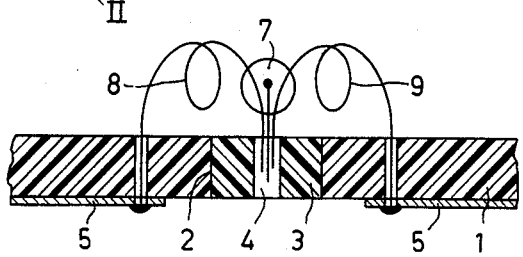
FIG. 2 is a cross-sectional view through the printed wiring board of FIG. 1 taken on the line II—II.
Figure 3:
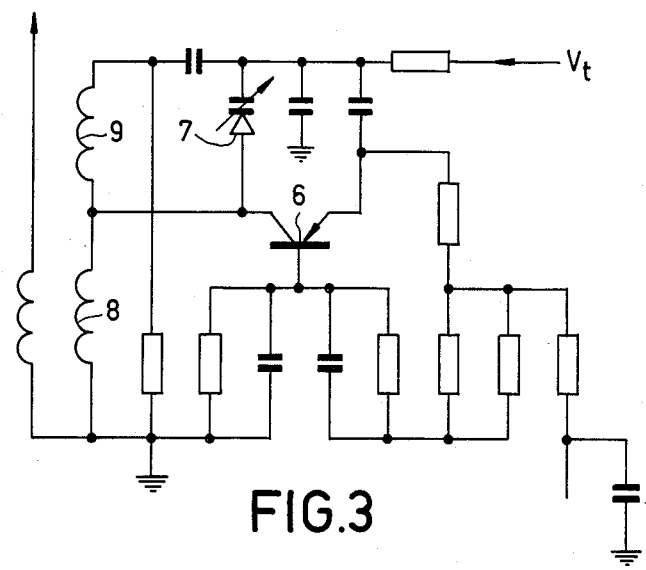
FIG. 3 shows a circuit diagram of an oscillation circuit.

A supporting plate 1 (printed wiring board) of electrically insulating material has an opening 2. A body 3 of a moisture impermeable material which can withstand the soldering temperature, for example polytetrafluoroethylene, is pressed into the opening 2. Member 3, the shape of which is not critical—it may, for example, be square—but which for practical reasons is shown as a ring in the drawing, has an aperture 4. Supporting plate 1 has a network of conductors 5, for example, of (etched out) copper. A number of circuit components, such as a transistor 6, a varicap diode 7 and two inductors 8, 9, are interconnected through network of conductors 5. The components 6, 7, 8, 9 have connections extending into the aperture 4 of the member 3 and are electrically interconnected there. The variations of the oscillation frequency of the oscillator circuit of which these components form part (see FIG. 3) prove to be considerably less in a test, in a given case 70% less, than the variations of the oscillator frequency of the same circuit but provided on a supporting plate without an opening, in which at the location of the member 3 a portion of the network of conductors was present to which the connections of the components 6, 7, 8, 9 were soldered.

Providing a moisture impermeable member into a printed wiring board presents advantages not only in oscillator circuits but also in non-oscillator circuits which have a moisture-sensitive place. An advantage not yet mentioned is that by providing such a member in a critical place in the printed wiring board the supporting plate may without any objections be manufactured from a material which does not satisfy the requirement of moisture impermeability, for example, a paper-based laminate. Without the invention it would be necessary to manufacture the complete supporting plate from a moisture impermeable material in order to obtain a comparable effect. Such a moisture-impermeable plate is more expensive and raises the cost of the circuit assembly.

What is claimed is:

1. An electric circuit assembly, comprising:
   a printed wiring board made of a first electrically insulating material, having a plurality of openings therethrough for electrical interconnections,
   a network of printed circuit conductors on the board, and
   at least two circuit components interconnected through said conductors and interconnections,
   characterized in that said first electrically insulating material has a given impermeability to moisture,
   said printed wiring board has one opening having a size greater than the other openings for interconnections,
   said assembly comprises a single member only, made of a second electrically insulating material having a moisture impermeability greater than the impermability of said first material, and having a single aperture therethrough, said member being fitted in said one opening, and
   a plurality of said circuit components are electrically interconnected by connections disposed in said aperture.

2. An assembly as claimed in claim 1, characterized in that the member is formed from a minimum moisture-absorbing, solder-resistant synthetic resin.

3. An assembly as claimed in claim 2, characterized in that said first material is a glass fiber-reinforced polyester resin, and said second material is polytetrafluoroethylene.

4. An assembly as claimed in claim 2, characterized in that said first material is a paper-based laminate, and said second material is polytetrafluoroethylene.

5. An assembly as claimed in claim 1, in which each of said plurality of circuit components has a respective plurality of leads, one respective lead only of each of said plurality of circuit components being interconnected in said aperture. greater than the other openings for interconnections, and one member only made of said second material is fitted in said one opening.

6. An assembly as claimed in claim, 1, in which said circuit comprises a transistor and at least one passive component, said transistor having a lead wire and said passive component having a lead wire, characterized in that said lead wires are interconnected in said aperture.

7. An assembly as claimed in claim 6, comprising at least two said passive components forming a resonant circuit, a lead wire from each of said at least two passive components being interconnected in said aperture.

8. An assembly as claimed in claim 7, characterized in that said at least two passive components are a frequency determining circuit of an oscillator, and said transistor lead wire is a collector lead.

* * * * *

UNITED STATES PATENT AND TRADEMARK OFFICE
CERTIFICATE OF CORRECTION

PATENT NO. : 4,554,614

DATED : Nov. 19, 1985

INVENTOR(S) : HENDRICUS M VAN DER WIJST

It is certified that error appears in the above-identified patent and that said Letters Patent is hereby corrected as shown below:

IN THE CLAIMS:

Claim 5, line 5, delete "greater than the other openings"
lines 6 and 7 delete in their entirety Signed and Sealed this Third Day of November, 1987

Attest:

DONALD J. QUIGG

Attesting Officer

Commissioner of Patents and Trademarks